United States Patent [19]

Brower

[11] 4,456,946
[45] Jun. 26, 1984

[54] SUBMINIATURE ARRAY WITH FLEXIBLE REFLECTOR

[75] Inventor: Boyd G. Brower, Williamsport, Pa.

[73] Assignee: GTE Products Corporation, Stamford, Conn.

[21] Appl. No.: 438,690

[22] Filed: Nov. 3, 1982

[51] Int. Cl.³ ............................................. G03B 15/02
[52] U.S. Cl. ...................................... 362/15; 362/13;
  362/240; 362/241; 362/251; 362/295; 362/297;
  362/307; 362/320; 362/346; 362/375; 431/357
[58] Field of Search .................... 431/357; 362/15, 13,
  362/240, 241, 251, 295, 320, 346, 297, 307, 375

[56] References Cited
U.S. PATENT DOCUMENTS 4,240,786  12/1980  Heytmeijer ........................ 362/15

Primary Examiner—Stephen J. Lechert, Jr.
Attorney, Agent, or Firm—Thomas H. Buffton

[57] ABSTRACT

In a subminiature multilamp photoflash array having a plastic reflector member formed to provide a plurality of cavities each having a flashlamp therein and a flexible back portion, the electrical leads of the flashlamp pass through the reflector member and are positioned intermediate the flexible portion thereof and a printed circuit on a circuit board affixed to the reflector member.

14 Claims, 5 Drawing Figures

4,456,946

SUBMINIATURE ARRAY WITH FLEXIBLE REFLECTOR

TECHNICAL FIELD

This invention relates to subminiature multilamp photoflash arrays and more particularly to subminiature photoflash arrays having a plastic reflector with a flexible portion enhancing electrical contact between a printed circuit and a pair of electrical leads of a photoflash lamp.

BACKGROUND ART

In the field of multilamp photoflash arrays, it is necessary to effect electrical connection of a plurality of flashlamp electrical conductors to a printed circuit affixed to a circuit board. Among the techniques employed to effect such electrical connections are twisting, soldering, welding, ultrasonic bonding and by means of fasteners such as screws, eyelets, clamps and rivets for example.

More specifically, U.S. Pat. No. 4,048,716 of Jehlicka suggests a photoflash array wherein a plurality of eyelets are affixed to a circuit board in electrical connection with a printed circuit. The electrical leads of the flashlamps are inserted into the eyelets and the extended shank portion of the eyelets is bent to capture the electrical lead within the eyelet and the eyelet in the circuit board.

Another known approach to affixing the leads of flashlamps to a printed circuit of a multilamp photoflash array is suggested in U.S. Pat. No. 4,028,798 of Bechard et al. Herein, electrical connection between the electrical conductors of the flashlamps and a printed circuit is effected by a method wherein a tool drives the flashlamp conductor through a plastic member, such as a circuit board, and into contact with a printed circuit run. The tool may be heated or vibrated such that the flashlamp conductors are held in place by embedment in the circuit board material. Other alternatives suggested include a method wherein the flashlamp conductors overlap the printed circuit and are driven into the circuit board adjacent the printed circuit run. Also, the flashlamp conductors may be inserted into openings in the circuit board and driven into contact with the bottom side of the printed circuit run by embedment into the circuit board with a heated tool.

Another somewhat related arrangement is suggested in U.S. Pat. No. 4,334,262 issued to Latos. Therein a multilamp photoflash array includes a plurality of flashlamp, each having a pair of electrical conductors. These electrical conductors are affixed to a printed circuit, by soldering for example, secured in slotted openings. The conductors are bent back upon themselves to provide a spring action whereby the mechanical spring action supports the flashlamp intermediate the front and back covers of the array.

Although the above-described methods and photoflash arrays utilizing the various-described techniques for attaching flashlamps have been and still are utilized with varying degrees of success, there are structures and photoflash arrays which have different requirements. For example, photoflash arrays of the miniaturized variety wherein space is severely restricted encounter considerable difficulty in attempting to employ eyelets which are not only expensive but also require much needed space. Also, structures which employ thermoplastic materials are severely limited in so far as the use of soldering because of the limited temperature tolerance of the thermoplastics.

Various techniques for affixing the flashlamp leads and establishing electrical connection thereof to a printed circuit without welding, soldering or eyelets are suggested in patent applications bearing U.S. Ser. Nos. 359,465; 359,468; and 359,467, all filed Mar. 12, 1982. Therein, the electrical leads of the photoflash lamp are trapped intermediate a plastic reflector and a printed circuit. However, in each instance, the printed circuit and the reflector unit must be either perfectly flat or have an interference fit in order to establish reliable electrical contact. However, an interference fit tends to cause undesired problems because the electrical leads hold the circuit board and the reflector member apart which not only causes misalignment but also is deleterious to sonic sealing since the sonic energy tends to undesirably embed the electrical leads in the plastic reflector.

OBJECTS AND SUMMARY OF THE INVENTION

An object of the invention is to provide an enhanced miniaturized multilamp photoflash array. Another object of the invention is to improve the electrical connection of the conductors of a flashlamp and printed circuit in a miniaturized array having limited available space. Still another object of the invention is to reduce cost and improve manufacturing efficiency of a miniaturized multilamp photoflash array. A further object of the invention is to improve the structural liability of sonically affixed plastic members entrapping electrical conductors and a printed circuit.

These and other objects, advantages and capabilities are achieved in one aspect of the invention by a miniaturized multilamp photoflash array having a reflector member with a flexible portion and plurality of cavities, each containing a photoflash lamp with electrical conductors. The electrical conductors of the flashlamps pass through the reflector member and are positioned intermediate the flexible portion of the reflector member and a printed circuit board which is in turn affixed to the reflector member.

BEST MODE FOR CARRYING OUT THE INVENTION

For a better understanding of the present invention, together with other and further objects, advantages and capabilitites thereof, reference is made to the following disclosure and appended claims in conjunction with the accompanying drawings.

Figure 1:
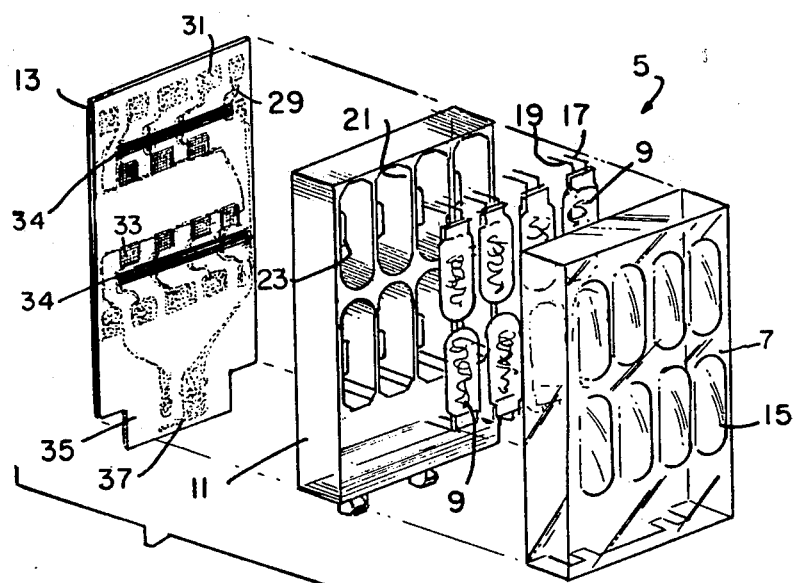
FIG. 1 is an exploded perspective view of a miniaturized multilamp photoflash array illustrating an embodiment of the invention.
Figure 2:
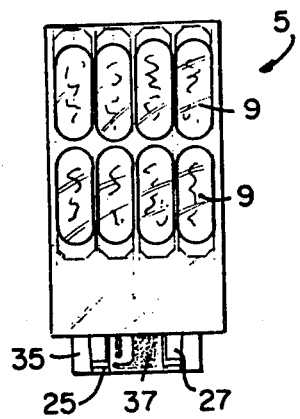
FIG. 2 is a plan view of the multilamp photoflash array of FIG. 1.

Referring to the drawings, FIGS. 1 and 2 illustrate a miniaturized multilamp photoflash array 5 having a plastic cover member 7, a plurality of photoflash lamps 9, a reflector member 11 and planar support platform 13. The cover member 7 is a light-transmittable plastic member of a box-like configuration and includes a plurality of outwardly extending bulbous portions 15. The bulbous portions 15, in this embodiment, are each formed for alignment with a flashlamp 9. Moreover, each of the flashlamps 9 includes the usual pair of electrical leads or conductors 17 and 19.

The reflector member 11 is a plastic configuration having a plurality of spaced flashlamp-receiving cavities 21, each of which includes an open-back portion 23. This open-back portion 23 of each cavity 21 serves to transmit radiation available from the flashlamp 9 disposed within the cavity 21. Also, each of the cavities 21 includes a slot (not shown) as well as the open back portion 23 of the reflector member 11 and includes passageway for the electrical conductors 17 and 19 of each of the flashlamps 9. Also, the reflector member 11 includes a pair of spaced and outwardly extending leg members 25 and 27 which are formed for passage into and engagement within a camera receiving slot (not shown). Moreover, the reflector member 11 is formed to fit into the cover member 7 with each flashlamp 9 aligned with a bulbous portion 15 of the cover member 7 and the spaced leg members 25 and 27 insertable into a camera.

The planar support platform 13 serves as a closure member for the photoflash array 5 and includes a printed electrical circuit 29 on the inner surface thereof. This printed electrical circuit 29 includes a plurality of electrically conductive portions or pads 31 formed and positioned for electrical connection to the electrical conductors or leads 17 and 19 of the flashlamps 9. A plurality of radiation-responsive switches, normally-open and normally closed, 33 and 34 are also located on the surface of the support platform and in a position to respond to radiation from a flashlamp 9 transmitted by way of the open-back portion 23 of the reflector member 11. Thus, the switches 33 and 34 are converted from one conductive state to another by the radiation received from a flashlamp 9.

Also, the planar support member 13 includes an outwardly extending tab portion 35 having a width greater than the width of the spaced leg members 25 and 27 and formed for insertion into a camera array receiving slot. This tab portion 35 includes a circuit means 37 thereon which is utilized to electrically connect a camera to the printed electrical circuit 29 of the planar support platform 13.

Figure 3:
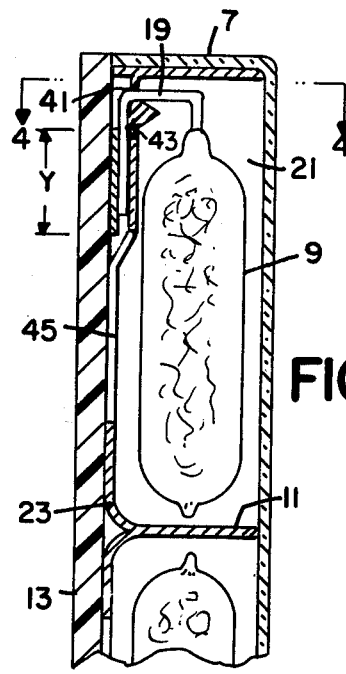
FIG. 3 is a side view illustrating the reflector member and flexible portion thereof with associated flashlamps.
Figure 4:
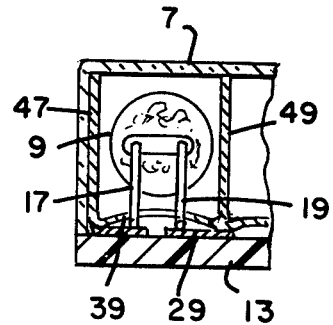
FIG. 4 is a cross-sectional view of the embodiment of FIG. 3 taken along the lines 3—3.

Referring more specifically to the electrical connection of the flashlamps 9, the side view of FIG. 3 and cross-sectional view of FIG. 4 illustrate a flashlamp 9 disposed within a cavity portion 21 of a reflector member 11. The reflector member 11 has a back portion 23 affixed, as by sonic sealing for example, to the inner surface of a planar support platform 13. A light transmittable cover member 7 encloses the flashlamp 9 within the cavity portion 21 and is affixed to the planar support platform 13.

The back portion 23 of the reflector member 11 has a flexible portion 39. Also, the back portion 23 includes first, second and third openings, 41, 43 and 45 respectively with the flexible portion 39 positioned between the second and third openings 43 and 45 and the third opening 45 formed to permit passage therethrough of radiation from the flashlamp 9 and activation of the radiation-responsive switches, 33 and 34 of FIG. 1, affixed to the printed circuit 29 on the inner surface of the planar support platform 13. The electrical leads 17 and 19 of the flashlamp 9 pass through the first opening 41 of the back portion 23 of the reflector member 11 and are positioned intermediate the flexible portion 39 of the reflector member 11 and the printed circuit 29 on the inner surface of the planar support platform 13.

Figure 5:
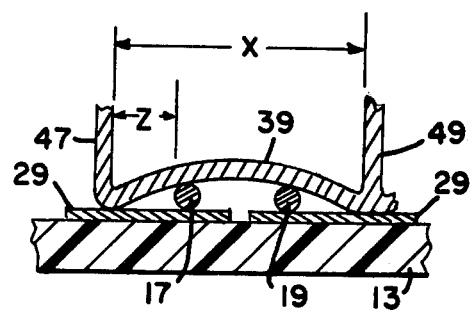
FIG. 5 is an exaggerated enlargement of the cross-sectional view of FIG. 4.

Referring to the flexible portion 39 of the reflector member 11, as more clearly illustrated in FIGS. 4 and 5, the cavity portion 21 of the reflector member 11 is defined, in part, by a pair of upstanding support members 47 and 49. The flexible portion 39 of the reflector member 11, is a given length "X" of FIG. 5 extending intermediate the support members 47 and 49. Also, the flexible portion 39 has a given width, "Y" of FIG. 3, as measured along the longitudinal axis of the flashlamp 9. Moreover, the electrical leads 17 and 19 are spaced a given distance, "Z" of FIG. 5, from the support members 47 and 49 in order to prevent undesired sharp bends and catastrophic failures of the flexible portion 39. However, the electrical leads 17 and 19 are also spaced from one another such that the flexible member 39 retains its flexibility and still exerts a force thereon sufficient to maintain electrical contact between the electrical leads 17 and 19 and the printed circuit 29.

In a specific example, a reflector member 11 was fabricated from a high-impact polystyrene, known commercially as Tuf-Flex 329 and available from the Plastic Division of the American Hoechst Corporation of Leominster, Mass. 01453. The flexible portion 39 had a length "X" of about 0.190 inch, a width "Y" of about 0.060 inch and a thickness of about 0.010 inch. The electrical leads 17 and 19 of the flashlamps 9 each had a diameter of about 0.014 inch and each was spaced about 0.030 inch, "Z," from one of the support members 47 and 49.

Alternatively, configurations have been fabricated utilizing a medium-impact polystyrene, known as Fostarene 50, for example. Morever, it has been found that a preferred reflector configuration provides a minimum clearance between the electrical leads 17 and 19 and the support members 47 and 49 of about one diameter of the lead wires 17 and 19, and is of a length of not less than about 0.150 inch. In this manner, the flexible portion 39 remains sufficiently resilient to permit sonic attachment of the reflector member 11 to the planar support platform 13 and to maintain pressure between the electrical conductors 17 and 19 and the printed circuit 29 in an amount sufficient to provide electrical connection therebetween. Moreover, the above-mentioned desirable effects are provided without breakage or failure of the flexible portion 39 of the reflector member 11.

While there has been shown and described what is at present considered the preferred embodiments of the invention, it will be obvious to those skilled in the art that various changes and modifications may be made therein without departing from the invention as defined by the appended claims.

I claim:

1. A miniaturized multilamp photoflash array comprising: a light transmittable plastic cover member;
    planar support platform having a printed circuit on the inner surface thereof;
    A plastic reflector member positioned within said plastic cover member and affixed to said planar support platform, said reflector member having a plurality of lamp-receiving cavities portions with each cavity portion having a back member with a flexible portion; and A flashlamp disposed within each of said cavity portions of said reflector member, said flashlamp having a pair of electrical leads passing through said back member of said cavity and positioned intermediate said flexible portion of said reflector and said printed circuit on said inner surface of said planar support platform.

2. The miniaturized multilamp photoflash array of claim 1 wherein said flexible portion separates a pair of open portions of said back member of each of said cavity portions of said reflector member and said electrical leads pass through one of said pair of open portions and are positioned intermediate said flexible portion of said reflector member and said printed circuit on said inner surface of said planar support platform.

3. The miniaturized multilamp photoflash array of claim 1 wherein said lamp-receiving cavities of said reflector members are separated by a support member and said flexible portion of said back member of each of said cavity portion extends intermediate a pair of said support members.

4. The miniaturized multilamp photoflash array of claim 1 wherein each of said pair of electrical leads of said flashlamp is positioned intermediate said flexible portion of said cavity portion of said reflector member and said printed circuit on said inner surface of said planar support platform and at a distance from a support member separating said cavity portions of not less than the diameter of one of said leads.

5. The miniaturized multilamp photoflash array of claim 1 wherein said cavity portions of said reflector member are separated by a support member and said flexible portion of said back member of each of said cavity portions extends intermediate said support members and in a direction along the longitudial axis of said cavity portions intermediate a pair of open portions.

6. The miniaturized multilamp photoflash array of claim 1 wherein said reflector member is formed of molded polystyrene material.

7. The miniaturized multilamp photoflash array of claim 1 wherein said reflector member is a polystyrene material with a flexible portion having a thickness of about 0.010 inch.

8. The miniaturized multilamp photoflash array of claim 1 wherein said reflector member is a polystyrene material having a flexible portion of a thickness of about 0.010 inch, a length of not less than about 0.150 inch and a width of about 0.060 inch.

9. In a miniaturized multilamp photoflash array having a light transmittable cover member and a planar support platform with a printed circuit on the inner surface thereof, the improvement comprising a reflector member positioned within said cover member and affixed to said planar support platform, said reflector member having a plurality of cavity portions each having a back member with a flexible portion and a flashlamp having a pair of electrical leads disposed within each of said cavity portions with said electrical leads passing through said back member of said reflector member and positioned intermediate said flexible portion of said reflector and said printed circuit on said inner surface of said planar support platform.

10. The improvement of claim 9 wherein said flexible portion of said back member of said reflector member separates a pair of open portions and said electrical leads pass through one of said open portions and are positioned between said flexible portion and said printed circuit on said inner surface of said planar support platform.

11. The improvement of claim 9 wherein said reflector member includes a support member intermediate each of said plurality of cavity portions and said flexible portion extends intermediate a pair of said support members.

12. The improvement of claim 9 wherein said reflector member is formed of polystyrene material and said flexible portion is of a thickness of about 0.010 inch.

13. The improvement of claim 9 wherein said flexible portion of said reflector member extends intermediate a pair of support members and each of said electrical leads is positioned intermediate said flexible portion and said planar support platform and spaced from a support member by a distance substantially equal to or greater than the diameter of one of said electrical leads.

14. The improvement of claim 9 wherein said flexible portion of said reflector member is polystyrene having a length of not less than about 0.150 inch, a width of about 0.060 inch and a thickness of about 0.010 inch and said electrical conductors are of a diameter of about 0.014 inch.

* * * * *